United States Patent
Chen et al.

(10) Patent No.: US 9,054,821 B2
(45) Date of Patent: Jun. 9, 2015

(54) APPARATUS AND METHOD FOR FREQUENCY LOCKING

(71) Applicants: Kuan-Yu Chen, Hsinchu County (TW); Yuan-Min Hu, Taoyuan County (TW)

(72) Inventors: Kuan-Yu Chen, Hsinchu County (TW); Yuan-Min Hu, Taoyuan County (TW)

(73) Assignee: Faraday Technology Corp., Science-Based Industrial Park, Hsin-Chu (TW)

(*) Notice: Subject to any disclaimer, the term of this patent is extended or adjusted under 35 U.S.C. 154(b) by 0 days.

(21) Appl. No.: 14/135,593

(22) Filed: Dec. 20, 2013

(65) Prior Publication Data

US 2015/0131766 A1      May 14, 2015

(30) Foreign Application Priority Data

Nov. 12, 2013   (TW) .............................. 102141079 A

(51) Int. Cl.
    *H04L 7/033*     (2006.01)
    *H04J 3/06*      (2006.01)

(52) U.S. Cl.
    CPC ................. *H04J 3/062* (2013.01); *H04L 7/033* (2013.01)

(58) Field of Classification Search
    CPC .............. G06F 5/06; G06F 5/10; G06F 5/12; G06F 5/14; G11C 7/22; H04J 3/062; H04L 7/033
    See application file for complete search history.

(56) References Cited

U.S. PATENT DOCUMENTS

| | | | |
|---|---|---|---|
| 6,882,662 B2* | 4/2005 | Subrahmanyan et al. | 370/506 |
| 8,698,539 B1* | 4/2014 | Nayyar et al. | 327/291 |
| 8,831,064 B1* | 9/2014 | Kaviani | 375/134 |
| 2002/0075980 A1* | 6/2002 | Tang et al. | 375/372 |
| 2003/0227988 A1* | 12/2003 | Subrahmanyan et al. | 375/372 |
| 2005/0220240 A1* | 10/2005 | Lesso | 375/372 |
| 2006/0034410 A1* | 2/2006 | Sanduleanu et al. | 375/376 |
| 2009/0055677 A1* | 2/2009 | Chen | 713/600 |
| 2012/0110365 A1 | 5/2012 | Wong et al. | |
| 2013/0066451 A1* | 3/2013 | Ganesan et al. | 700/94 |

* cited by examiner

*Primary Examiner* — Aristocratis Fotakis
(74) *Attorney, Agent, or Firm* — Winston Hsu; Scott Margo

(57) ABSTRACT

An apparatus and a method for frequency locking are provided. The apparatus includes a phase-locked loop (PLL), a local clock generator, a data buffer unit and a control unit. The PLL locks the phase and the frequency of a radio frequency signal to generate a recovery clock signal and received data. The data buffer unit writes the received data into an elastic buffer of the data buffer unit according to the frequency of the recovery clock signal, and reads the received data from the elastic buffer according to the frequency of a local clock signal generated by the local clock generator. The control unit obtains a write-in address and a read-out address in the elastic buffer, and sends a control signal to the local clock generator for adjusting the frequency of the local clock signal according to relationship between the write-in address and the read-out address.

22 Claims, 5 Drawing Sheets

APPARATUS AND METHOD FOR FREQUENCY LOCKING

CROSS-REFERENCE TO RELATED APPLICATION

This application claims the priority benefit of Taiwan application serial no. 102141079, filed on Nov. 12, 2013. The entirety of the above-mentioned patent application is hereby incorporated by reference herein and made a part of this specification.

BACKGROUND

1. Technical Field

The invention relates to an electronic apparatus. Particularly, the invention relates to an apparatus and a method for frequency locking.

2. Related Art

In recent years, along with rapid development of mobile electronic apparatuses such as smart phones, digital cameras and MP3 players, etc., users have increasing demand on data transmission between the electronic apparatuses, and a data transmission speed gradually draws the user's attention.

Generally, the data transmission between the electronic apparatuses can be divided into cable transmission and wireless transmission, and under a current technique, the highest speed of the cable transmission is still higher than that of the wireless transmission. Regarding the cable transmission, the mobile electronic apparatus is generally connected to an external electronic apparatus, for example, a personal computer or a notebook computer, etc., through a connecting port. The above connecting port is compatible to a transmission standard, for example, a universal serial bus (USB) standard.

Under such standard, data transmitted between the connecting port of the mobile electronic apparatus and the external electronic apparatus is transmitted in a certain specific frequency, so that the connecting port has to be capable of generating a clock signal of the specific frequency. In order to copy with the specification of the transmission standard and ensure a receiver (for example, the above external electronic apparatus) to correctly receive data according to the clock signal, the frequency of the clock signal has to be stable. Generally, a quartz oscillator is used in the connecting port to produce the clock signal. However, compared to other types of oscillators, although the clock signal produced by the quartz oscillator is accurate, the cost thereof is high. Moreover, when a temperature of the mobile electronic apparatus, an environment temperature, or other condition is changed, the characteristic of the quartz oscillator is probably changed, which may shift the frequency of the clock signal produced by the quartz oscillator, such that correctness of the transmitted/received data is decreased. Therefore, how to produce the accurate clock signal without using the quartz oscillator is an issue concerned by those skilled in the art.

SUMMARY

The invention is directed to an apparatus and a method for frequency locking, by which a radio frequency signal is locked to generate a corresponding recovery clock signal, and a frequency of a local clock signal is correspondingly generated and adjusted.

The invention provides a frequency locking apparatus, which includes a phase-locked loop (PLL), a local clock generator, a data buffer unit and a control unit. The PLL receives a radio frequency signal and locks a phase and a frequency of the radio frequency signal to generate a recovery clock signal and a received data. The local clock generator generates a local clock signal. The data buffer unit is coupled to the PLL and the local clock generator. The data buffer unit writes the received data into an elastic buffer in the data buffer unit according to a frequency of the recovery clock signal, and reads the received data from the elastic buffer according to a frequency of the local clock signal. The control unit is coupled to the data buffer unit and the local clock generator, where the control unit reads a write-in address and a read-out address in the elastic buffer, and sends a control signal to the local clock generator for adjusting the frequency of the local clock signal according to a relationship between the write-in address and the read-out address.

The invention provides a method for frequency locking, which is adapted to a frequency locking apparatus applying a transmission interface without a quartz oscillator. The method includes following steps. A radio frequency signal is received, and a phase and a frequency of the radio frequency signal are locked to generate a recovery clock signal and a received data. The received data is written into the position of a write-in address in an elastic buffer according to a frequency of the recovery clock signal, and the received data is read from the position of a read-out address in the elastic buffer according to a frequency of a local clock signal. The frequency of the local clock signal is adjusted according to a relationship between the write-in address and the read-out address.

According to the above descriptions, the relationship between the recovery clock signal and the local clock signal is found according to an operation status of the elastic buffer of the data buffer unit, and the frequency of the local clock signal is correspondingly adjusted according to the relationship, such that the local clock signal is synchronized to the clock signal of a receiver circuit.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
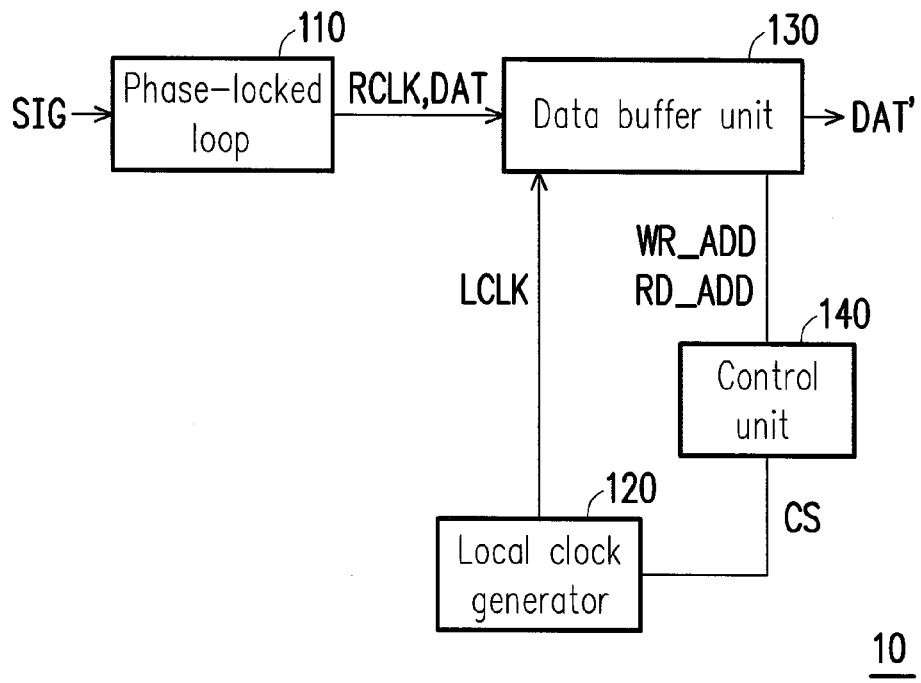
FIG. 1 is a functional block diagram of a frequency locking apparatus according to an embodiment of the invention.

FIG. 1 is a functional block diagram of a frequency locking apparatus according to an embodiment of the invention. Referring to FIG. 1, the frequency locking apparatus 10 includes a phase locked loop (PLL) 110, a local clock generator 120, a data buffer unit 130 and a control unit 140. The PLL 110 receives a radio frequency (RF) signal SIG from an external apparatus (for example, an external electronic apparatus connected through a transmission interface) of the frequency locking apparatus 10. The transmission interface can be any cable transmission interface or any wireless transmission interface. The PLL 110 locks a phase and/or a frequency of the RF signal SIG to generate a recovery clock signal RCLK and received data DAT. The local clock generator 120 generates a local clock signal LCLK, and determines a frequency of the local clock signal LCLK under control of a control signal CS. The data buffer unit 130 is coupled to the PLL 110 and the local clock generator 120. The data buffer unit 130 writes the received data DAT into the position of a write-in address WR_ADD in an elastic buffer of the data buffer unit 130 according to a frequency of the recovery clock signal RCLK, and reads the received data DAT' from the position of a read-out address RD_ADD in the elastic buffer according to a frequency of the local clock signal LCLK, and transmits the same to a next stage circuit (not shown).

The control unit 140 is coupled to the data buffer unit 130 and the local clock generator 120. The control unit 140 reads the write-in address WR_ADD and the read-out address RD_ADD in the elastic buffer of the data buffer unit 130, and sends the control signal CS to the local clock generator 120 for adjusting the frequency of the local clock signal LCLK according to a relationship between the write-in address WR_ADD and the read-out address RD_ADD.

Figure 2:
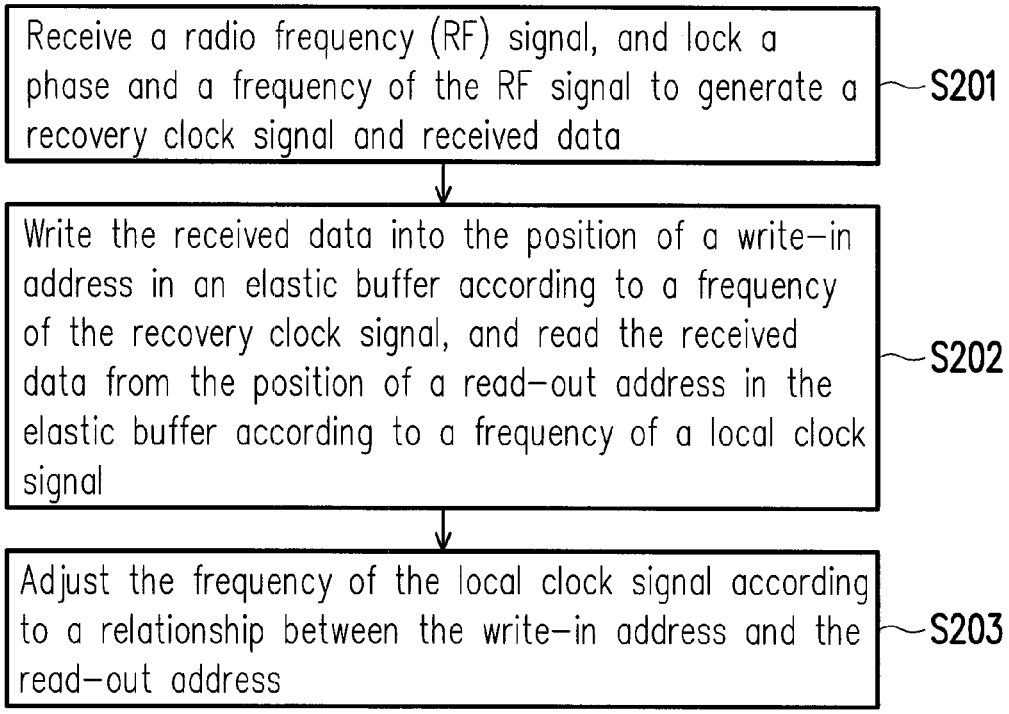
FIG. 2 is a flowchart illustrating a method for frequency locking according to an embodiment of the invention.

FIG. 2 is a flowchart illustrating a method for frequency locking according to an embodiment of the invention. The method for frequency locking of FIG. 2 can be adapted to the frequency locking apparatus (for example, the frequency locking apparatus 10 of FIG. 1) applying a transmission interface without a quartz oscillator. Referring to FIG. 2, first, in step S201, a RF signal is received, and a phase and a frequency of the RF signal are locked to generate a recovery clock signal and received data. In step S202, the received data is written into the position of a write-in address in an elastic buffer according to a frequency of the recovery clock signal, and the received data is read from the position of a read-out address in the elastic buffer according to a frequency of a local clock signal. Then, in step S203, the frequency of the local clock signal is adjusted according to a relationship between the write-in address and the read-out address.

The aforementioned elastic buffer (which is, for example, included in the data buffer unit 130 of FIG. 1) is a first in first out (FIFO) buffer, and the received data can be written into the elastic buffer in a predetermined write-in frequency (for example, the recovery clock signal RCLK in the embodiment of FIG. 1), and then the received data can be read in a predetermined read-out frequency (for example, the local clock signal LCLK in the embodiment of FIG. 1). According to such characteristic, the elastic buffer can be used to compensate a difference between a data write-in speed and a data read-out speed, such that data error and omission caused by the frequency difference between the recovery clock signal RCLK and the local clock signal LCLK is avoided. The control unit 140 of the frequency locking apparatus 10 can determine a relationship (for example, a phase difference or a frequency difference) between a write-in frequency (the frequency of the recovery clock signal RCLK) and a read-out frequency (the frequency of the local clock signal LCLK) according to a relationship of a write-in operation and a read-out operation performed to the elastic buffer.

In the present embodiment, the control unit 140 of the frequency locking apparatus 10 determines a relationship between the recovery clock signal RCLK and the local clock signal LCLK according to the write-in address WR_ADD and the read-out address RD_ADD read from the elastic buffer of the data buffer unit 130, and adjusts the frequency of the local clock signal LCLK according to the aforementioned determination result, such that the frequency of the local clock signal CLK may approach to the frequency of the recovery clock signal RCLK.

Figure 3:
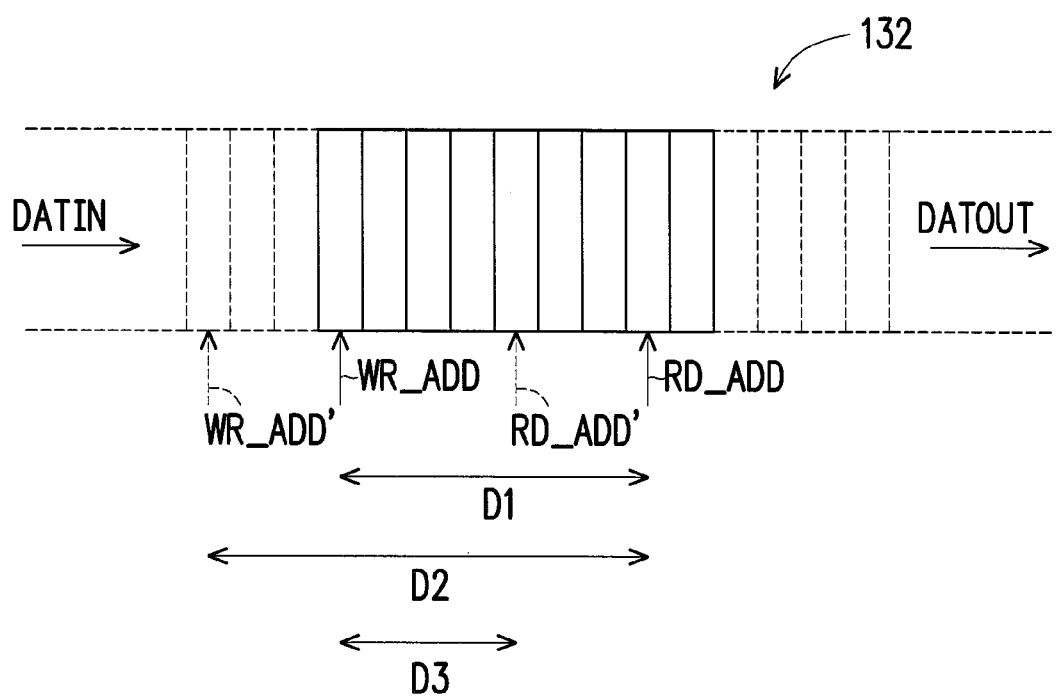
FIG. 3 is a schematic diagram of a relationship between a write-in address and a read-out address in an elastic buffer according to an embodiment of the invention.

FIG. 3 is a schematic diagram of a relationship between the write-in address WR_ADD and the read-out address RD_ADD in the elastic buffer according to an embodiment of the invention. Related descriptions of the elastic buffer 132 of FIG. 3 are adapted to the elastic buffer of the data buffer unit 130 in the embodiment of FIG. 1. In FIG. 3, a plurality of grids contained in the elastic buffer 132 represents a plurality of storage spaces, and the spaces respectively correspond to different addresses. It should be noticed that the relationship between the write-in address WR_ADD and the read-out address RD_ADD shown in FIG. 3 is only used to determine the relationship between the recovery clock signal RCLK and the local clock signal LCLK, and in an actual application, the write-in address and the read-out address are not necessarily exactly the same to the write-in address WR_ADD and the read-out address RD_ADD shown in FIG. 3. Actual addresses of the write-in address WR_ADD and the read-out address RD_ADD are probably different along with different implementations of the elastic buffer, which are not limited by the invention.

As that shown in FIG. 3, the data received by the elastic buffer 132 is written into the elastic buffer 132 along a direction DATIN, and is read out along a direction DATOUT. In case that a data writing speed (corresponding to the frequency of the recovery clock signal RCLK) is rather close to a data reading speed (corresponding to the frequency of the local clock signal LCLK), a distance between the addresses pointed by the write-in address WR_ADD and the read-out address RD_ADD tends to be stable, i.e. the address distance between the write-in address WR_ADD and the read-out address RD_ADD is not largely varied. Namely, the distance between the write-in address WR_ADD and the read-out address RD_ADD approaches to a fixed value (for example, a distance D1 shown in FIG. 3). In this case, the control unit 140 controls the local clock generator 120 to maintain/keep the frequency of the local clock signal LCLK through the control signal CS.

When the current writing speed of the elastic buffer 132 is faster than the reading speed (i.e. the frequency of the recovery clock signal RCLK is greater than the frequency of the local clock signal LCLK), the received data pre-stored in the elastic buffer 132 that is not yet read out is increased. Increase of the received data in the elastic buffer 132 that is not yet read out may increase the address distance between the write-in address WR_ADD and the read-out address RD_ADD. For example, as that shown in FIG. 3, the write-in address WR_ADD is moved to the left of FIG. 3 to reach a write-in address WR_ADD'. In this way, the distance between the write-in address WR_ADD and the read-out address RD_ADD is changed to a distance D2 shown in FIG. 3, which is greater than the original distance D1. In this case, when the control unit 140 determines that the frequency difference between the frequency of the recovery clock signal RCLK (the writing speed) and the frequency of the local clock signal LCLK (the reading speed) is greater than a first predetermined value according to the distance D2 between the write-in address WR_ADD and the read-out address RD_ADD, the control unit 140 generates the corresponding control signal CS according to the aforementioned frequency difference, and transmits the control signal CS to the local clock generator 120 to increase the frequency of the local clock signal LCLK.

When the current writing speed of the elastic buffer 132 is lower than the reading speed (i.e. the frequency of the recovery clock signal RCLK is smaller than the frequency of the local clock signal LCLK), the received data pre-stored in the elastic buffer 132 that is not yet read out is decreased. Decrease of the received data in the elastic buffer 132 that is not yet read out may decrease the address distance between the write-in address WR_ADD and the read-out address RD_ADD. For example, as that shown in FIG. 3, the read-out address RD_ADD is moved to the left of FIG. 3 to reach a read-out address RD_ADD'. In this way, the distance between the write-in address WR_ADD and the read-out address RD_ADD is changed to a distance D3 shown in FIG. 3, which is smaller than the original distance D1. In this case, when the control unit 140 determines that the frequency difference between the frequency of the recovery clock signal RCLK (the writing speed) and the frequency of the local clock signal LCLK (the reading speed) is smaller than a second predetermined value according to the distance D3 between the write-in address WR_ADD and the read-out address RD_ADD, the control unit 140 generates the corresponding control signal CS according to the aforementioned frequency difference, and transmits the control signal CS to the local clock generator 120 to decrease the frequency of the local clock signal LCLK.

The aforementioned first predetermined value and the second predetermined value can be real numbers, and the second predetermined value is smaller than the first predetermined value. If the frequency difference is not greater than the first predetermined value, for example, the frequency difference is between the first predetermined value and the second predetermined value, the control unit 140 can control the local clock generator 120 to maintain/keep the current frequency of the local clock signal LCLK through the control signal CS. The first predetermined value and the second predetermined value can be determined according to an actual product design.

In brief, when the control unit 140 determines that the frequency difference between the frequency of the recovery clock signal RCLK and the frequency of the local clock signal LCLK is greater than the first predetermined value, the control unit 140 controls the local clock generator 120 to increase the frequency of the local clock signal LCLK through the control signal CS. When the control unit 140 determines that the frequency difference between the frequency of the recovery clock signal RCLK and the frequency of the local clock signal LCLK is smaller than the second predetermined value, the control unit 140 controls the local clock generator 120 to decrease the frequency of the local clock signal LCLK through the control signal CS. When the frequency difference between the frequency of the recovery clock signal RCLK and the frequency of the local clock signal LCLK is between the first predetermined value and the second predetermined value, the control unit 140 controls the local clock generator 120 to maintain the current frequency of the local clock signal LCLK through the control signal CS.

Comparison between the frequency difference and the first predetermined value and the second determination value can be a real-time comparison, and can also be a comparison between an average of the frequency differences accumulated within a statistical period (for example, within a multiple of time of the period of the recovery clock signal RCLK) and the first predetermined value and the second determined value, which is not limited by the invention. For example, the control unit 140 accumulates the differences between the write-in address WR_ADD and the read-out address RD_ADD (i.e. the distance there between) within a statistical period, and further calculates an average of the differences. When the average of the differences between the write-in address WR_ADD and the read-out address RD_ADD accumulated within the statistical period is greater than a first threshold, the control unit 140 determines that the frequency difference between the recovery clock signal RCLK and the local clock signal LCLK is greater than the first predetermined value. Therefore, the control unit 140 controls the local clock generator 120 to increase the frequency of the local clock signal LCLK through the control signal CS. When the average of the differences between the write-in address WR_ADD and the read-out address RD_ADD accumulated within the statistical period is smaller than a second threshold, the control unit 140 determines that the frequency difference between the recovery clock signal RCLK and the local clock signal LCLK is smaller than the second predetermined value. Therefore, the control unit 140 controls the local clock generator 120 to decrease the frequency of the local clock signal LCLK through the control signal CS.

In another embodiment of the invention, the control unit 140 respectively sets a threshold for the write-in address WR_ADD and the read-out address RD_ADD. When the write-in address WR_ADD or the read-out address RD_ADD exceeds the threshold, even if the frequency difference is between the first predetermined value and the second predetermined value, the control unit 140 still adjusts the frequency of the local clock signal LCLK. For example, when the control unit 140 determines that the write-in address WR_ADD or the read-out address RD_ADD is greater than an overflow threshold, it represents that the elastic buffer 132 is to be overflow probably, and the control unit 140 transmits the control signal CS to the local clock generator 120 to temporarily increase the frequency of the local clock signal LCLK until the write-in address WR_ADD and the read-out address RD_ADD are smaller than the overflow threshold. For another example, when the control unit 140 determines that the write-in address WR_ADD or the read-out address RD_ADD is smaller than a clear threshold, it represents that the elastic buffer is to be cleared probably, and the control unit 140 transmits the control signal CS to the local clock generator 120 to temporarily decrease the frequency of the local clock signal LCLK until the write-in address WR_ADD and the read-out address RD_ADD are greater than the overflow threshold.

On the other hand, a possible reason that causes the write-in address WR_ADD to be greater than the overflow threshold or the read-out address RD_ADD to be lower than the clear threshold is that the recovery clock signal RCLK has a large change, or a difference between the first predetermined value and the second predetermined value is too large, such that the adjustment performed according to the situation of the embodiment of FIG. 3 cannot properly adjust the frequency of the local clock signal LCLK to be synchronous to the frequency of the recovery clock signal RCLK. Therefore, in an embodiment of the invention, when the write-in address WR_ADD is greater than the overflow threshold or the read-out address RD_ADD is lower than the clear threshold, besides that the control unit 140 adjusts the frequency of the local clock signal LCLK through the control signal CS, a setting of the first predetermined value and/or the second predetermined value is further dynamically adjusted (for example, the difference between the first predetermined value and the second predetermined value is decreased).

On the other hand, when the elastic buffer (for example, the elastic buffer 132 shown in FIG. 3) in the data buffer unit 130 of FIG. 1 is to be overflow or underflow, the elastic buffer in the data buffer unit 130 can actively transmit an overflow signal or an underflow signal to the control unit 140. When the control unit 140 receives the overflow signal from the elastic buffer in the data buffer unit 130, the control unit 140 can control the local clock generator 120 to increase the frequency of the local clock signal LCLK through the control signal CS. When the control unit 140 receives the underflow signal from the elastic buffer in the data buffer unit 130, the control unit 140 can control the local clock generator 120 to decrease the frequency of the local clock signal LCLK through the control signal CS. It should be noticed that when the control unit 140 receives the overflow signal or the underflow signal from the elastic buffer in the data buffer unit 130, it represents that the frequency difference between the recovery clock signal RCLK and the local clock signal LCLK is too large, and the control unit 140 also performs a more substantial (large step) adjustment on the local clock signal LCLK through the control signal CS.

Figure 4:
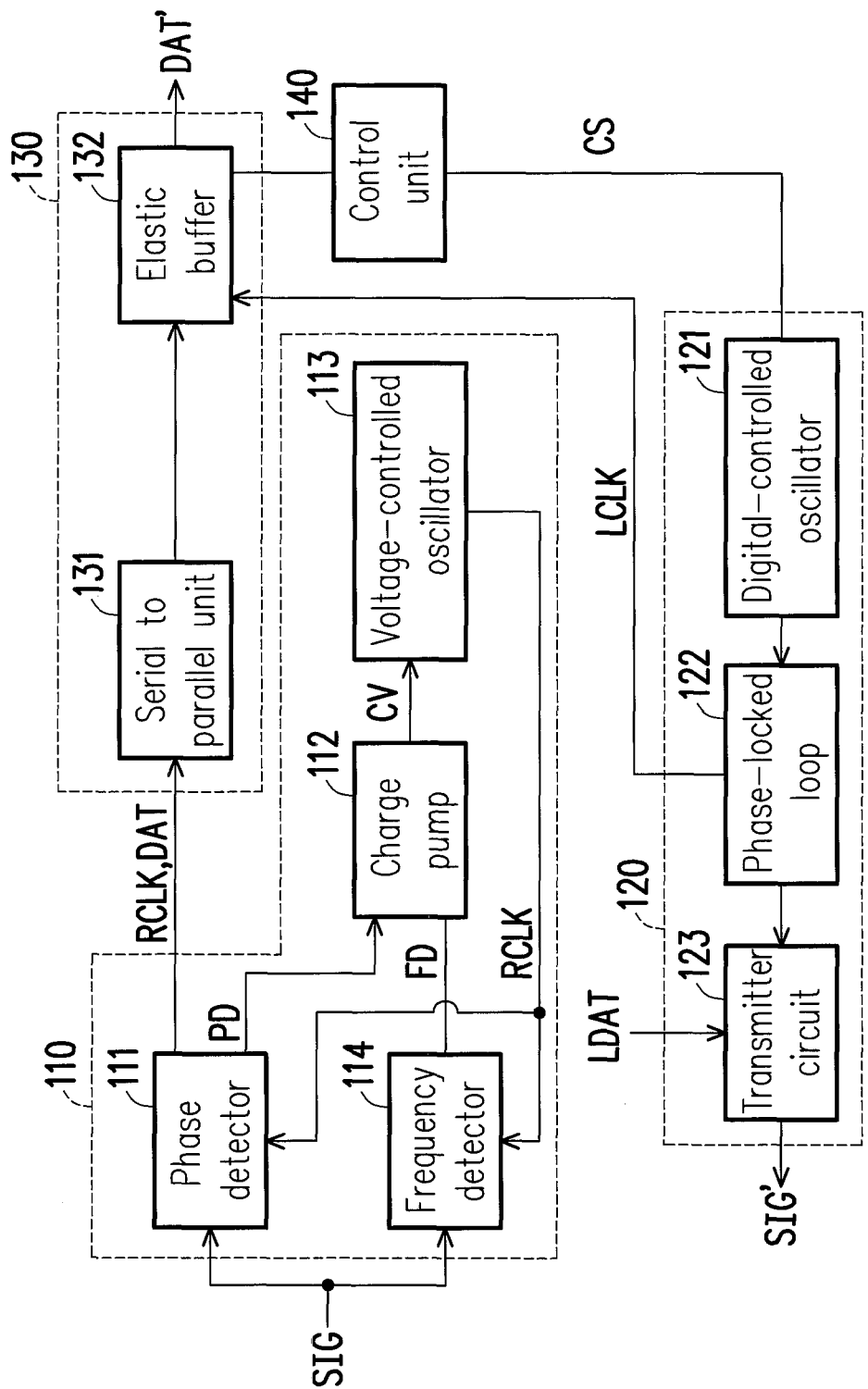
FIG. 4 is a block schematic diagram of a frequency locking apparatus according to another embodiment of the invention.

FIG. 4 is a block schematic diagram of a frequency locking apparatus according to another embodiment of the invention. The embodiment of FIG. 4 provides a detailed implementation of the frequency locking apparatus compared to that of the embodiment of FIG. 1. The embodiment of FIG. 4 can be deduced according to related descriptions of FIG. 1 and FIG. 2. Referring to FIG. 4, in the present embodiment, the PLL 110 includes a phase detector 111, a charge pump 112, a voltage-controlled oscillator 113 and a frequency detector 114. The phase detector 111 receives the RF signal SIG and the recovery clock signal RCLK, and generates a phase difference signal PD to the charge pump 112 according to a phase difference between the RF signal SIG and the recovery clock signal RCLK. The charge pump 112 is coupled to the phase detector 111. The charge pump 112 receives the phase difference signal PD, and generates a corresponding charging voltage CV according to the phase difference signal PD. The voltage-controlled oscillator 113 is coupled to the charge pump 112 for receiving the charging voltage CV. The voltage-controlled oscillator 113 generates/determines the frequency of the recovery clock signal RCLK according to the charging voltage CV, and transmits the recovery clock signal RCLK to the phase detector 111. Therefore, the PLL 110 may lock a phase of the RF signal SIG through a closed loop formed by the phase detector 111, the charge pump 112 and the voltage-controlled oscillator 113. Moreover, in the invention, the phase detector 111 may sample the RF signal SIG to obtain the received data DAT according to a timing of the recovery clock signal RCLK, and transmit the received data DAT and the recovery clock signal RCLK to the data buffer unit 130.

It should be noticed that in the present embodiment, the PLL 110 also includes the frequency detector 114 coupled between the voltage-controlled oscillator 113 and the charge pump 112. The voltage-controlled oscillator 113 further transmits the recovery clock signal RCLK to the frequency detector 114. The frequency detector 114 generates a corresponding frequency difference signal FD according to a frequency difference between the RF signal SIG and the recovery clock signal RCLK, and transmits the frequency difference signal FD to the charge pump 112. In this way, the charge pump 112 generates the charging voltage CV according to both of the phase difference signal PD and the frequency difference signal FD, so as to control the voltage-controlled oscillator 113 to adjust the frequency of the recovery clock signal RCLK. Therefore, the PLL 110 can lock the frequency of the RF signal SIG through a closed loop formed by the frequency detector 114, the charge pump 112 and the voltage-controlled oscillator 113.

Figure 5:
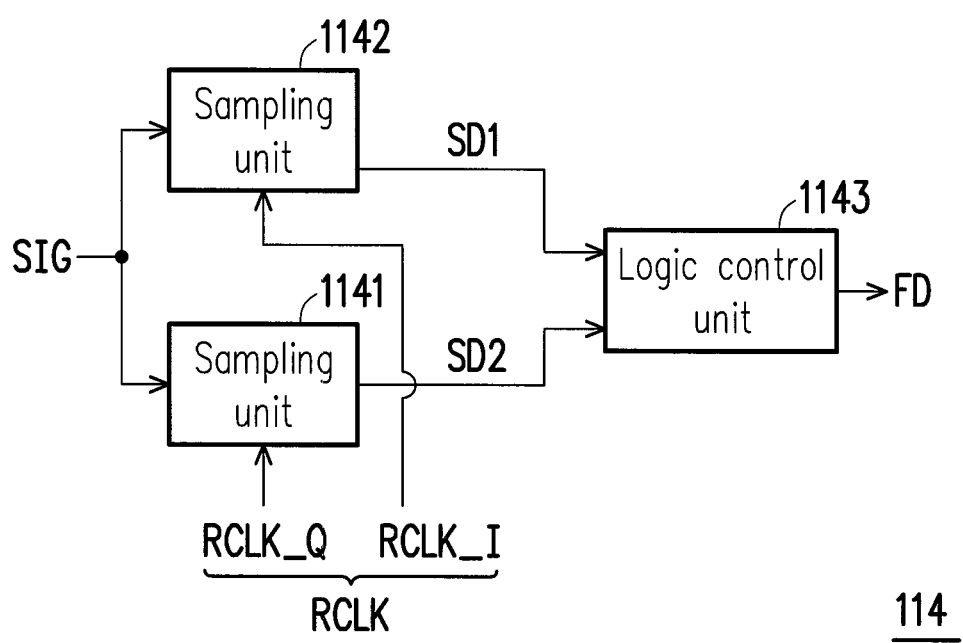
FIG. 5 is a functional block schematic diagram of a frequency detector of FIG. 4 according to an embodiment of the invention.

FIG. 5 is a functional block schematic diagram of the frequency detector of FIG. 4 according to an embodiment of the invention. Referring to FIG. 4 and FIG. 5, in the present embodiment, the frequency detector 114 includes a sampling unit 1141, a sampling unit 1142 and a logic control unit 1143. In the present embodiment, the recovery clock signal RCLK received from the voltage-controlled oscillator 113 by the frequency detector 114 includes an in-phase clock signal RCLK_I and a quadrature clock signal RCLK_Q, where the in-phase clock signal RCLK_I and the quadrature clock signal RCLK_Q have a phase difference of 90 degrees. The sampling units 1141 and 1142 respectively sample the RF signal SIG to obtain sampling data SD1 and SD2 according to a frequency of the in-phase clock signal RCLK_I and a frequency of the quadrature clock signal RCLK_Q. The logic control unit 1143 is coupled to the sampling units 1141 and 1142. The logic control unit 1143 compares the contents of the sampling data SD1 and SD2 to determine a relationship between the frequency of the recovery clock signal RCLK and the frequency of the RF signal SIG, and generates and adjusts the frequency difference signal FD according to the relationship between the frequencies of the recovery clock signal RCLK and the RF signal SIG. Therefore, the logic control unit 1143 can generate the frequency difference signal FD to the charge pump 112 according to the sampling data SD1 and SD2. In this way, the charge pump 112 can generate and adjust the charging voltage CV according to both of the phase difference signal PD and the frequency difference signal FD, such that the charging voltage CV can accurately reflect the frequency relationship between the RF signal SIG and the recovery clock signal RCLK.

Referring back to FIG. 4, in the present embodiment, the data buffer unit 130 includes a serial to parallel unit 131 connected to the PLL 110 and the elastic buffer 132. The serial to parallel unit 131 is coupled between the PLL 110 and the elastic buffer 132. In the present embodiment, before the received data DAT is written into the elastic buffer 132, the serial to parallel unit 131 can convert the received data DAT provided by the PLL 110 from a serial data format to a parallel data format. According to the frequency of the recovery clock signal RCLK, the serial to parallel unit 131 can write the received data DAT of the parallel format into the elastic buffer 132. According to the principle of first in first out, the elastic buffer 132 temporarily stores the current received data DAT provided by the serial to parallel unit 131, and outputs the previous received data DAT'. Therefore, a next stage circuit (for example, an external data processing circuit (not shown)) connected to the elastic buffer 132 can read the previous received data DAT' from the elastic buffer 132 according to the frequency of the local clock signal LCLK, so as to perform subsequent processing on the received data DAT'. Therefore, the frequency locking apparatus 10 shown in FIG. 4 can be applied in a high-speed transmission interface including a serializer/deserializer (SerDes).

It should be noticed that the serial to parallel unit 131 of FIG. 4 can be selectively implemented, namely, the serial to parallel unit 131 may have different implementations along with different transmission interfaces used by the frequency locking apparatus 10. For example, in other embodiments, the serial to parallel unit 131 shown in FIG. 4 can be replaced by other data processing modules/circuits to implement other data processing operations to the received data DAT, which is not limited by the invention. Related operations of the elastic buffer 132 may refer to related descriptions of the embodiment of FIG. 1 and FIG. 3, which are not repeated.

On the other hand, the local clock generator 120 includes a digital-controlled oscillator 121, a PLL 122 and a transmitter circuit 123. The digital-controlled oscillator 121 is coupled to the control unit 140, and receives the control signal CS from the control unit 140, and generates the local clock signal LCLK according to the control signal CS. In the present embodiment, the control signal CS generated by the control unit 140 is a digital signal, and the digital-controlled oscillator 121 adjusts (increases/decreases) the frequency of the generated local clock signal LCLK according to a digital value in the control signal CS. The PLL 122 is coupled to the digital-controlled oscillator 121, and receives the local clock signal LCLK from the digital-controlled oscillator 121, and locks the frequency of the local clock signal LCLK to ensure stability of the local clock signal LCLK. The PLL 122 transmits the locked local clock signal LCLK to the elastic buffer 132 of the data buffer unit 130. The transmitter circuit 123 is coupled to the PLL 122, and receives the local clock signal LCLK from the PLL 122. According to the local clock signal LCLK, the transmitter circuit 123 can modulate local data LDAT into a RF signal SIG', and transmits the RF signal SIG' to a communication apparatus (for example, a remote host) outside the frequency locking apparatus 10 through a transmission interface. Now, the frequency of the local clock signal LCLK is the same to the frequency of the RF signal SIG'.

In another embodiment of the invention, a voltage-controlled oscillator is configured in the local clock generator 120 to replace the digital-controlled oscillator 121 of FIG. 4 to generate the local clock signal LCLK. In the other embodiment, the control signal CS generated by the control unit 140 is actually a control voltage, and the voltage-controlled oscillator can generate and adjust the frequency of the local clock signal LCLK according to the control voltage.

Figure 6:
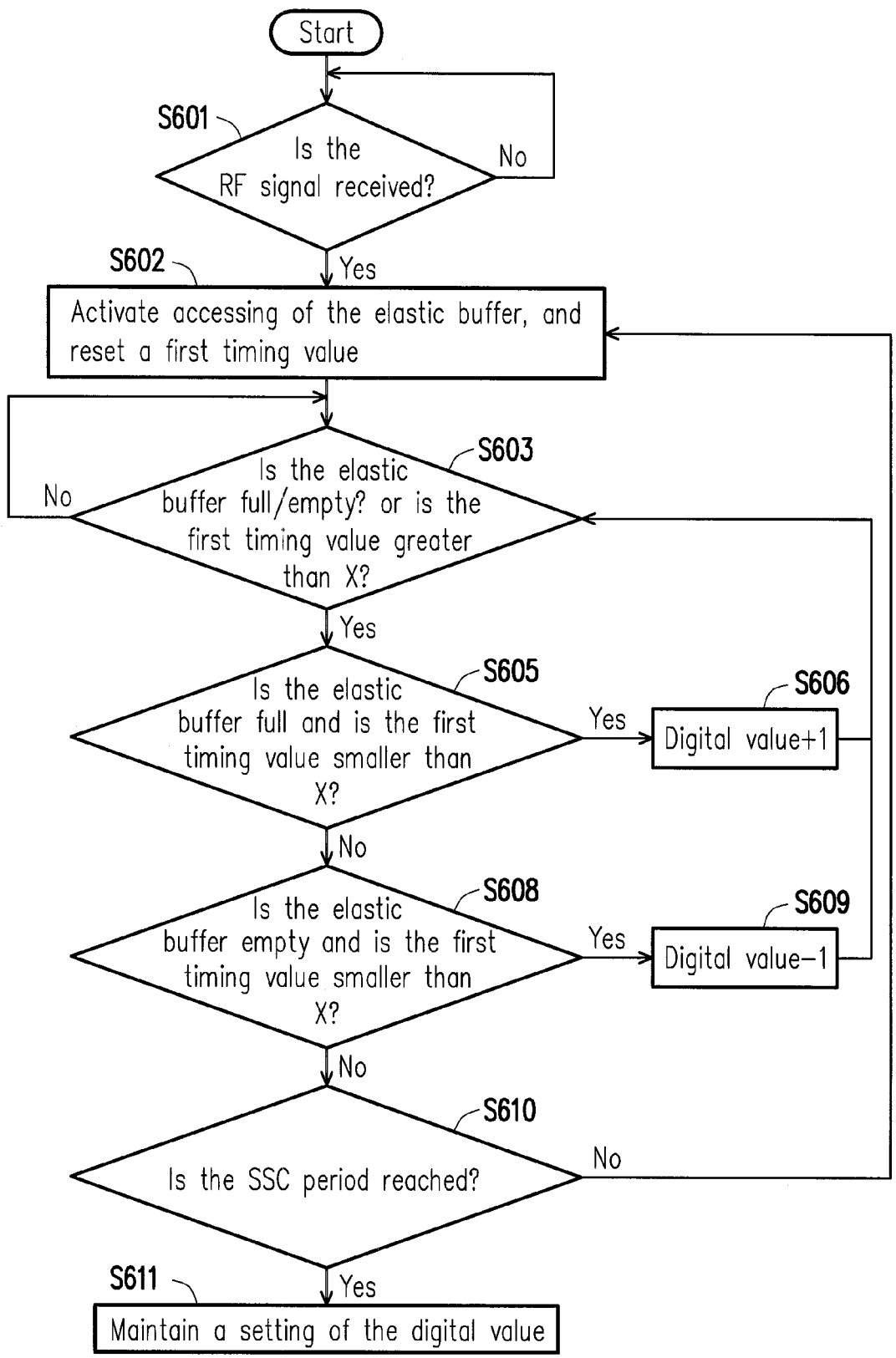
FIG. 6 is a flowchart illustrating a method for frequency locking according to another embodiment of the invention.

FIG. 6 is a flowchart illustrating a method for frequency locking according to another embodiment of the invention. In the embodiment of FIG. 6, the RF signal SIG can be a spread spectrum clock (SSC) signal. The SSC signal has a SSC period. Referring to FIG. 4 and FIG. 6, in step S601, the control unit 140 first determines whether the RF signal SIG is received. When it is determined that the RF signal SIG is received, in step S602, the control unit 140 activates accessing of the elastic buffer 132, i.e. writes the received data DAT into the elastic buffer 132 according to the frequency of the clock signal RCLK. In the step S602, the control unit 140 sets the control signal CS to a predetermined digital value (initial value) and controls the local clock generator 120 to generate the local clock signal LCLK. According to the frequency of the local clock signal LCLK, the received data DAT' stored in the elastic buffer 132 is read out from the elastic buffer 132 according to the principle of first in first out. The control unit 140 resets a timer (a first timer) in the step S602. The timer in the control unit 140 can accumulate a first timing value, and another timer (a second timer) in the control unit 140 can accumulate a second timing value, where the first timing value and the second timing value correspond to a period of the recovery clock signal RCLK for counting the number of periods of the recovery clock signal RLCK. The control unit 140 can check whether the first timing value reaches a value X, and check the second timing value to learn whether the SSC period is ended. Namely, the second timing value times the period of the recovery clock signal RLCK is smaller than or equal to the SSC period.

Then, in step S603, the control unit 140 determines whether the elastic buffer 132 is full/empty, or whether the first timing value is greater than the value X. When the elastic buffer 132 in the data buffer unit 130 is overflow or underflow, the elastic buffer 132 can actively/passively transmit an overflow signal or an underflow signal to the control unit 140. The control unit 140 can determine whether the elastic buffer 132 is full/empty according to whether the overflow signal or the underflow signal is received form the elastic buffer 132.

On the other hand, the value X is a value preset in the control unit 140, which represents the number of periods that the elastic buffer 132 is to be overflow/underflow (full/empty). Therefore, the value X is between 1 and the SSC period divided by the period of the recovery clock signal RLCK. The value X can be determined according to an actual product design. For example, when the frequency locking apparatus and the method for frequency locking of the invention are applied to a universal serial bus (USB) 3.0 standard, the value X and the first timing value can also be applied to calculate a longest time of inserting an SKP ordered set.

If the determination result of the step S603 is negative, the determination of the step S603 is performed during a next period of the recovery clock signal RLCK. If the determination result of the step S603 is affirmative, in step S605, the control unit 140 determines whether the first timing value is smaller than the value X, and determines whether the elastic buffer 132 is full. When the control unit 140 determines that the first timing value is smaller than the value X in the step S605, and the elastic buffer 132 is full, the control unit 140 executes a step S606 to add the digital value in the control signal CS by 1, so as to increase the frequency of the local clock signal LCLK generated by the local clock generator 120. After the step S606 is finished, the control unit 140 again performs the determination of the step S603 during the next period of the recovery clock signal RLCK. When the determination result of the step S605 is negative, the control unit 140 executes a step S608.

In the step S608, the control unit 140 determines whether the first timing value is smaller than the value X, and determines whether the elastic buffer 132 is empty. When the control unit 140 determines that the first timing value is smaller than the value X, and determines that the elastic buffer 132 is empty in the step S608, the control unit 140 executes a step S609 to decrease the digital value in the control signal CS by 1, so as to decrease the frequency of the local clock signal LCLK generated by the local clock generator 120. After the step S609 is finished, the control unit 140 again performs the determination of the step S603 during the next period of the recovery clock signal RLCK after transmitting the control signal CS. When the determination result of the step S608 is negative, the control unit 140 executes a step S610.

In the step S610, the control unit 140 determines whether the current second timing value of the second timer reaches the SSC period. If the determination result of the step S610 is negative, the flow returns to the step S602, by which the first timing value of the first timer is set to zero, and the steps S603-S610 are re-executed. If the determination result of the step S610 is affirmative, i.e. the current second timing value of the second timer reaches the SSC period, the control unit 140 maintains the setting of the digital value in the control signal CS, and sets the second timing value to zero.

In the present embodiment, the control unit 140 includes two working modes of a calibration mode and a background mode. When the control unit 140 is in the calibration mode, the control unit 140 completely executes the steps S601-S611, and repeatedly executes the steps S603-S611 in several SSC periods. After the control unit 140 confirms that the elastic buffer 132 does not have the situation of overflow or underflow (full/empty) in the several SSC periods, the control unit 140 maintains the digital value in the control signal CS, and maintains the frequency of the local clock signal LCLK.

When the control unit 140 is in the background mode, the operations executed by the control units 140 are similar as the operations executed in the calibration mode, and a difference there between is that the control unit 140 repeats the steps S603-S610 during M SSC periods, and if the elastic buffer 132 have the situation of overflow or underflow in N SSC periods of the M SSC periods, the control unit 140 further adjusts the digital value in the control signal CS to adjust the frequency of the local clock signal LCLK. The above values M and N can be adjusted according to an actual implementation. When the frequency locking apparatus 10 and an electronic apparatus are commonly set, and the frequency locking apparatus 10 serves as a part of the transmission interface, the calibration mode can be used when the electronic apparatus initiates the transmission interface, uses the frequency locking apparatus 10 to implement the data transmission. The background mode of the control unit 140 can be used when the electronic apparatus is in a normal working state, and the frequency locking apparatus 10 is not used to transmit data, though the transmission interface is not disconnected (for example, disconnected with the transmitter of the RF signal SIG).

The method for frequency locking in the embodiment of FIG. 6 is adapted to a transmission standard where the transmission interface has the SSC signal, and the data is transmitted through a serial mode, for example, a universal serial bus (USB) 3.0 standard, and the above implementation can be adjusted according to an actual requirement of the transmission interface.

In summary, the embodiments of the invention provide a frequency locking apparatus and a method for frequency locking, which are adapted to a transmission interface without a quartz oscillator, and can be integrated into a mobile electronic apparatus or an electronic apparatus. The frequency locking apparatus can opportunely lock the clock signal received from external (for example, through the above transmission interface) without using the quartz oscillator, and produces the local clock signal synchronous to the above clock signal, so as to correctly transmit/receive data.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A frequency locking apparatus, adapted to a transmission interface without a quartz oscillator, and comprising:
 a phase-locked loop, receiving a radio frequency signal, and locking a phase and a frequency of the radio frequency signal to generate a recovery clock signal and a received data;
 a local clock generator, generating a local clock signal;
 a data buffer unit, coupled to the phase-locked loop and the local clock generator, writing the received data into an elastic buffer in the data buffer unit according to a frequency of the recovery clock signal, and reading the received data from the elastic buffer according to a frequency of the local clock signal;
 a control unit, coupled to the data buffer unit and the local clock generator, wherein the control unit reads a write-in address and a read-out address in the elastic buffer, and sends a control signal to the local clock generator for adjusting the frequency of the local clock signal according to a relationship between the write-in address and the read-out address, wherein the control unit comprises a calibration mode, wherein when the control unit is in the calibration mode, the control unit
 a. determines whether the radio frequency signal is received, and activates accessing of the elastic buffer when the radio frequency signal is received;
 b. determines whether the elastic buffer is full or empty when a first timing value is smaller than a value X, and increases a digital value in the control signal when the elastic buffer is full, and decreases the digital value in the control signal when the elastic buffer is empty;
 c. determines whether a multiplication of a second timing value and a period of the recovery clock signal reaches a spread spectrum clock period, and resets the first timing value and repeats the step b when the multiplication of the second timing value and the period of the recovery clock signal does not reach the spread spectrum clock period; and
 d. stores the digital value and resets the second timing value to zero when the multiplication of the second timing value and the period of the recovery clock signal reaches the spread spectrum clock period.

2. The frequency locking apparatus as claimed in claim 1, wherein
 when the control unit determines that a frequency difference between the frequency of the recovery clock signal and the frequency of the local clock signal is greater than a first predetermined value according to the write-in address and the read-out address, the control unit controls the local clock generator to increase the frequency of the local clock signal through the control signal; and
 when the control unit determines that the frequency difference is smaller than a second predetermined value according to the write-in address and the read-out address, the control unit controls the local clock generator to decrease the frequency of the local clock signal through the control signal.

3. The frequency locking apparatus as claimed in claim 2, wherein when the control unit determines that the frequency difference is between the first predetermined value and the second predetermined value according to the write-in address and the read-out address, the control unit controls the local clock generator to maintain the frequency of the local clock signal through the control signal.

4. The frequency locking apparatus as claimed in claim 2, wherein
 the control unit accumulates differences between the write-in address and the read-out address within a statistical period, when an average of the differences between the write-in address and the read-out address accumulated within the statistical period is greater than a first threshold, the control unit determines that the frequency difference is greater than the first predetermined value; and
 when the average of the differences between the write-in address and the read-out address accumulated within the statistical period is smaller than a second threshold, the control unit determines that the frequency difference is smaller than the second predetermined value.

5. The frequency locking apparatus as claimed in claim 1, wherein
 when the control unit determines that the write-in address is greater than a third threshold, the control unit controls the local clock generator to increase the frequency of the local clock signal through the control signal; and
 when the control unit determines that the read-out address is smaller than a fourth threshold, the control unit controls the local clock generator to decrease the frequency of the local clock signal through the control signal.

6. The frequency locking apparatus as claimed in claim 1, wherein when the control unit receives an overflow signal from the elastic buffer, the control unit controls the local clock generator to increase the frequency of the local clock signal through the control signal; and when the control unit receives an underflow signal from the elastic buffer, the control unit controls the local clock generator to decrease the frequency of the local clock signal through the control signal.

7. The frequency locking apparatus as claimed in claim 1, wherein the phase-locked loop comprises:

a phase detector, receiving the radio frequency signal and the recovery clock signal, and generating a phase difference signal according to the radio frequency signal and the recovery clock signal, and sampling the radio frequency signal to obtain the received data by using the recovery clock signal;

a charge pump, coupled to the phase detector, and receiving the phase difference signal to generate a charging voltage; and a voltage-controlled oscillator, coupled to the charge pump, generating the recovery clock signal according to the charging voltage, and transmitting the recovery clock signal to the phase detector.

8. The frequency locking apparatus as claimed in claim 7, wherein the phase-locked loop further comprises:

a frequency detector, coupled to the charge pump, generating a frequency difference signal according to the radio frequency signal and the recovery clock signal, and transmitting the frequency difference signal to the charge pump, wherein the charge pump generates the charging voltage according to the phase difference signal and the frequency difference signal.

9. The frequency locking apparatus as claimed in claim 8, wherein the recovery clock signal comprises an in-phase clock signal and a quadrature clock signal having a phase difference of 90 degrees to each other, and the frequency detector comprises:

a first sampling unit, receiving the in-phase clock signal in the recovery clock signal, and sampling the radio frequency signal to obtain first sampling data according to a frequency of the in-phase clock signal;

a second sampling unit, receiving the quadrature clock signal in the recovery clock signal, and sampling the radio frequency signal to obtain second sampling data according to a frequency of the quadrature clock signal; and a logic control unit, coupled to the first sampling unit and the second sampling unit, and generating the frequency difference signal according to the first sampling data and the second sampling data.

10. The frequency locking apparatus as claimed in claim 1, wherein the data buffer unit comprises:

a serial to parallel unit, coupled between the phase-locked loop and the elastic buffer, and converting the received data from serial data into parallel data.

11. The frequency locking apparatus as claimed in claim 1, wherein the control unit further comprises a background mode, wherein when the control unit is in the background mode, the control unit executes the aforementioned steps a-c during M spread spectrum clock periods, and when the elastic buffer is overflow or underflow during N spread spectrum clock periods in the M spread spectrum clock periods, the control unit stores the digital value.

12. A method for frequency locking, adapted to a frequency locking apparatus applying a transmission interface without a quartz oscillator, and the method for frequency locking comprising:

receiving a radio frequency signal;

locking a phase and a frequency of the radio frequency signal to generate a recovery clock signal and a received data;

writing the received data into a position of a write-in address in an elastic buffer according to a frequency of the recovery clock signal;

reading the received data from a position of a read-out address in the elastic buffer according to a frequency of a local clock signal; and adjusting the frequency of the local clock signal according to a relationship between the write-in address and the read-out address, wherein the step of adjusting the frequency of the local clock signal according to the relationship between the write-in address and the read-out address comprises:

a. determining whether the elastic buffer is full or empty when a first timing value is smaller than a value X, increasing a digital value in a control signal when the elastic buffer is full, and decreasing the digital value in the control signal when the elastic buffer is empty, wherein the control signal is used for adjusting the frequency of the local clock signal;

b. determining whether a multiplication of a second timing value and a period of the recovery clock signal reaches a spread spectrum clock period, and resetting the first timing value and repeating the step a when the multiplication of the second timing value and the period of the recovery clock signal does not reach the spread spectrum clock period; and c. storing the digital value and resetting the second timing value to zero when the multiplication of the second timing value and the period of the recovery clock signal reaches the spread spectrum clock period.

13. The method for frequency locking as claimed in claim 12, wherein the step of adjusting the frequency of the local clock signal according to the relationship between the write-in address and the read-out address comprises:

determining a frequency difference between the frequency of the recovery clock signal and the frequency of the local clock signal according to the write-in address and the read-out address;

increasing the frequency of the local clock signal when the frequency difference is greater than a first predetermined value; and decreasing the frequency of the local clock signal when it is determined that the frequency difference is smaller than a second predetermined value according to the write-in address and the read-out address.

14. The method for frequency locking as claimed in claim 13, wherein the step of adjusting the frequency of the local clock signal according to the relationship between the write-in address and the read-out address further comprises:

maintaining the frequency of the local clock signal when it is determined that the frequency difference is between the first predetermined value and the second predetermined value according to the write-in address and the read-out address.

15. The method for frequency locking as claimed in claim 13, wherein the step of determining the frequency difference between the frequency of the recovery clock signal and the frequency of the local clock signal according to the write-in address and the read-out address comprises:

accumulating differences between the write-in address and the read-out address within a statistical period;

determining that the frequency difference is greater than the first predetermined value when an average of the differences between the write-in address and the read-out address accumulated within the statistical period is greater than a first threshold; and determining that the frequency difference is smaller than the second predetermined value when the average of the differences between the write-in address and the read-out address accumulated within the statistical period is smaller than a second threshold.

16. The method for frequency locking as claimed in claim 12, wherein the step of adjusting the frequency of the local clock signal according to the relationship between the write-in address and the read-out address comprises:

increasing the frequency of the local clock signal when it is determined that the write-in address is greater than a third threshold; and decreasing the frequency of the local clock signal when it is determined that the read-out address is smaller than a fourth threshold.

17. The method for frequency locking as claimed in claim 12, further comprising:

increasing the frequency of the local clock signal when the elastic buffer generates an overflow signal; and decreasing the frequency of the local clock signal when the elastic buffer generates an underflow signal.

18. The method for frequency locking as claimed in claim 12, wherein the step of locking the phase and the frequency of the radio frequency signal comprises:

generating a phase difference signal according to the radio frequency signal and the recovery clock signal, generating a charging voltage according to the phase difference signal; and generating the recovery clock signal according to the charging voltage.

19. The method for frequency locking as claimed in claim 18, wherein the step of locking the phase and the frequency of the radio frequency signal further comprises:

sampling the radio frequency signal to obtain first sampling data according to a frequency of an in-phase clock signal in the recovery clock signal;

sampling the radio frequency signal to obtain second sampling data according to a frequency of a quadrature clock signal in the recovery clock signal, wherein the in-phase clock signal and the quadrature clock signal have a phase difference of 90 degrees; and generating a frequency difference signal according to the first sampling data and the second sampling data.

20. The method for frequency locking as claimed in claim 19, wherein the step of generating the charging voltage according to the phase difference signal comprises:

generating the charging voltage according to the phase difference signal and the frequency difference signal.

21. The method for frequency locking as claimed in claim 18, further comprising:

converting the received data from serial data into parallel data.

22. The method for frequency locking as claimed in claim 12, wherein the step of c further comprises:

executing the aforementioned steps a-b during M spread spectrum clock periods, and storing the digital value when the elastic buffer is overflow or underflow during N spread spectrum clock periods in the M spread spectrum clock periods.

* * * * *